United States Patent [19]

Fraas et al.

[11] Patent Number: 5,217,539
[45] Date of Patent: Jun. 8, 1993

[54] III-V SOLAR CELLS AND DOPING PROCESSES

[75] Inventors: Lewis M. Fraas; Veeravana S. Sundaram, both of Issaquah; James E. Avery, Fall City; Peter E. Gruenbaum, Seattle; Eric Malocsay, Bellevue, all of Wash.

[73] Assignee: The Boeing Company, Seattle, Wash.

[21] Appl. No.: 755,316

[22] Filed: Sep. 5, 1991

[51] Int. Cl.⁵ .................. H01L 31/052; H01L 31/18; H01L 31/0304
[52] U.S. Cl. .................. 136/246; 136/249; 136/255; 136/256; 136/262; 437/5; 437/150; 437/153; 437/160; 437/161; 257/431
[58] Field of Search ............ 136/246, 249 TJ, 255, 136/256, 262; 437/5, 150, 153, 160, 161; 148/33.3; 357/30 B, 30 J, 30 F

[56] References Cited

U.S. PATENT DOCUMENTS 3,264,707 8/1966 Elie ........................ 437/167
5,091,018 2/1992 Fraas et al. ................ 136/246

FOREIGN PATENT DOCUMENTS 57-45273 3/1982 Japan ........................ 136/262
58-121688 7/1983 Japan ........................ 136/262
63-132485 6/1988 Japan ........................ 136/262

OTHER PUBLICATIONS

M. Garozzo et al, *Solar Energy Materials*, vol. 14, pp. 29-49 (1986).
H. J. Hovel et al, *IBM Tech. Disc. Bull.*, vol. 16, No. 7, Dec. 1973, pp. 2083-2084.
G. W. Turner et al, *Conf. Record, 16th IEEE Photovoltaic Specialists Conf.* (1982), pp. 1153-1156.
L. Fraas et al, *IEEE AES Magazine*, Nov. 1989, pp. 3-7.
S. G. Bailey, *Conf. Record, 20th IEEE Photovoltaic Specialists Conference* (1988), pp. 625-628.

Primary Examiner—Aaron Weisstuch
Attorney, Agent, or Firm—Donald J. Lisa

[57] ABSTRACT

Zinc diffusion procedures applicable for large scale manufacture of GaAs and GaSb cells used in tandem solar cells having a high energy conversion efficiency. The zinc doping and carrier concentration are restricted to be less than about $10^{19}/cm^3$ to obtain good light generated carrier collection and hence good short circuit currents. The amount of zinc that is available for diffusion during a drive-in heating step is restricted. Confinement of zinc and arsenic vapors during the heating step may be effected by use of a proximity source wafer or by an encapsulant layer. The zinc diffusion of GaSb is obtained by a homogeneous light diffusion that is followed by a patterned heavy diffusion to give low ohmic contact with the grid lines. Texture etching of the GaSb solar cell is also compatible with this diffusion process.

62 Claims, 6 Drawing Sheets

AlGaAs Window Applied Before Diffusion

Fig.7A — GaAs / AlGaAs

Fig.7B — SiO₂:Zn

Fig.7C — Isolate

Fig.7D — SiNx

Fig.7E — Junction

AlGaAs Window Applied After Diffusion

Fig.6A — SiNx / SiO₂:Zn / GaAs

Fig.6B — Junction

Fig.6C — Junction

Fig.6D — GaAs / AlGaAs

Fig.6E — Isolate

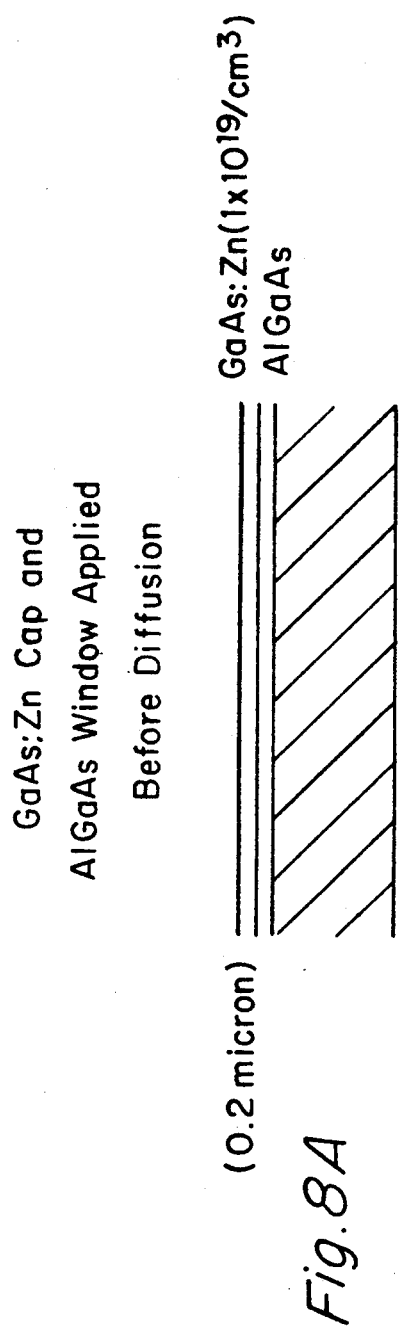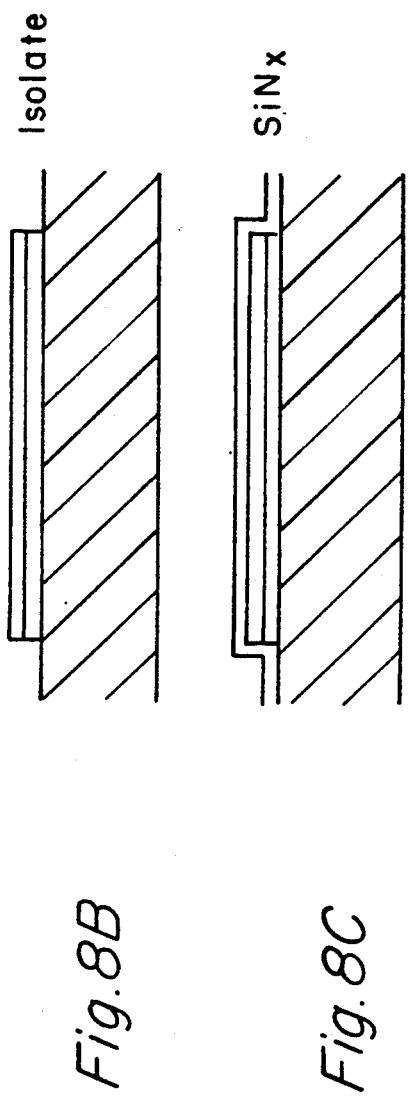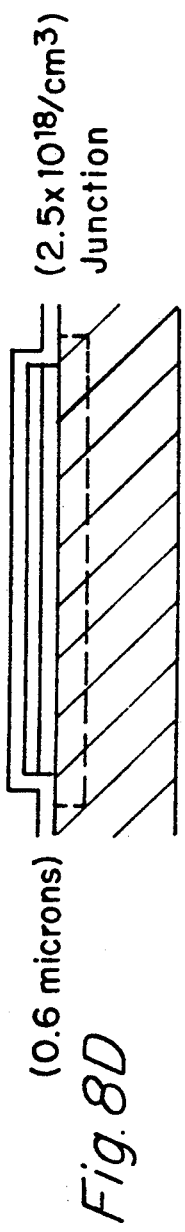
Fig.8A  GaAs:Zn Cap and AlGaAs Window Applied Before Diffusion (0.2 micron)
Fig.8B
Fig.8C
Fig.8D (0.6 microns)

Fig.9A
Fig.9B
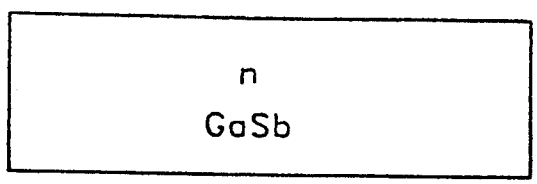
Fig.9C
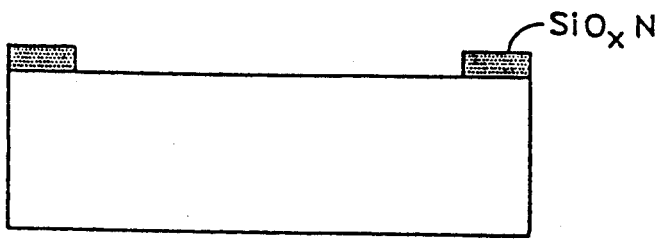
Fig.9D
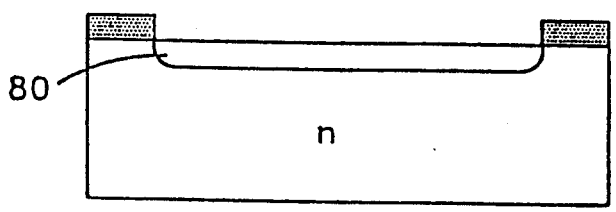
Fig.9E
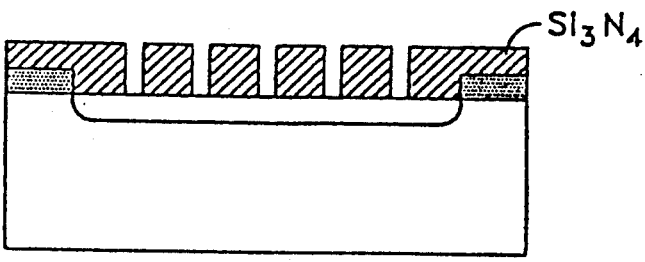
Fig.9F
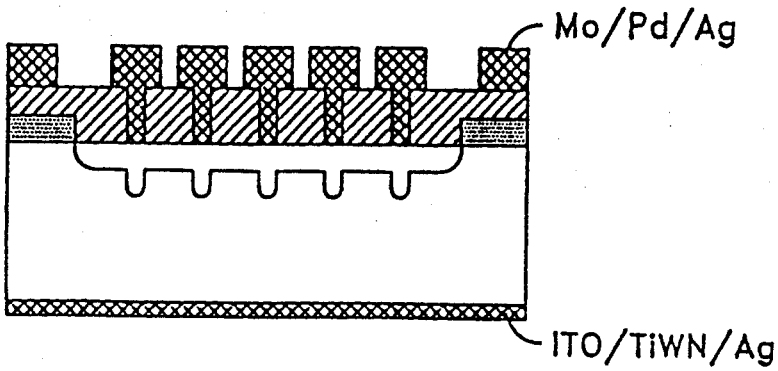

III-V SOLAR CELLS AND DOPING PROCESSES

TECHNICAL FIELD

This invention relates to improved methods of making semiconductor devices using III-V compound semiconductor material such as phosphides, arsenides, and antimonides of aluminum, gallium, and indium. More specifically, it relates to improved methods of making GaAs and GaSb solar cells.

BACKGROUND ART

III-V materials are useful in fabricating semiconductor devices such as heterostructure lasers, light emitting diodes, photovoltaic cells, and the like. In n-type III-V compound semiconductor wafers, a p-type conductivity modifier (e.g. zinc, cadmium, beryllium, or magnesium) is diffused into one wafer face in the presence of an inert ambient carrier gas to form a thin surface region of opposite conductivity, see, for example, Elie U.S. Pat. No. 3,264,707 and Fan et al. U.S. Pat. No. 4,547,622. Zinc in high concentration is frequently used to provide a highly doped contact layer which is an important ingredient for achieving a good ohmic contact with low contact resistance.

Zinc diffusion with high zinc concentrations is extensively used in disordering of GaAs/AlGaAs quantum wells to fabricate low threshold lasers. The more expensive epitaxy process to form the junction is replaced by zinc diffusion to form GaSb photoactive transducers as disclosed in Fraas et al. application Ser. No. 07/523,710 filed May 14, 1990, now Pat. No. 5,091,018. Attention is directed to that patent and the prior art cited therein as background prior art applicable to this invention.

Conventionally, zinc doping of III-V compound semiconductors is carried out by annealing the compound semiconductor at high temperatures in a "pseudo closed box" system. In the case of GaAs, a typical anneal would be at 600° C. under zinc arsenide and hydrogen ambient as zinc arsenide provides the zinc source and the needed arsenic overpressure to prevent decomposition of the GaAs surface. In the case of GaSb, elemental zinc and elemental antimony have been used to provide zinc diffusion without decomposition of the GaSb surface. Temperature and time determine the surface concentration of the zinc and depth of the emitter junction.

Prior GaAs diffusion techniques provide dopant concentrations well in excess of $10^{19}/cm^3$. We have found that a lighter dopant concentration is needed for high efficiency solar cells. Dopant concentrations less than about $10^{19}/cm^3$ are required to preserve minority carrier lifetimes in the solar cell zinc doped layer. Minority carrier lifetimes affect light generated carrier collection and hence short circuit currents.

In our earlier GaSb process, emitter etching has been used to provide a patterned diffusion that gives high energy conversion efficiency. A problem with this process is that cell costs are high because the process cannot be easily scaled up for mass production.

SUMMARY OF INVENTION

The present invention relates to an improved process using conductivity-type modifier diffusion techniques applicable to large scale production of the upper and lower cells in a tandem solar cell and to the resulting cells which are tailored for use together in a concentrator module for a tandem solar cell having high light conversion efficiency.

A GaAs solar cell is produced by applying the right amount of a dopant to the wafer surface as part of a diffusion process which includes heating to a dopant drive-in temperature for a time and under conditions so that the maximum dopant concentration at the surface is reduced and the junction depth is increased to achieve a diffusion profile that allows large scale production of cells with a high conversion efficiency.

The process may start with a transfer of a surprisingly small amount of dopant, e.g. much less than the number of atoms required to produce a full monolayer. Heating to a drive-in temperature for a controlled time while confining dopant vapor loss allows an emitter junction to be formed at a distance from the wafer surface to provide high light generated current. The dopant carrier concentration at the wafer surface is restricted to preserve the emitter minority carrier lifetime while maintaining a low series resistance. Holding the surface dopant concentration to a preferred value may be accomplished by adding an insulative layer over the dopant before the drive-in heating step to reduce loss by evaporation and thereafter removing the insulating layer.

The process according to one aspect of this invention provides a zinc doping of GaAs wafers by diffusion using a procedure which limits loss by evaporation of arsenic in the wafer and limits the amount of zinc to achieve a diffusion profile having controlled maximum dopant concentrations at the region nearest the surface and controlled diffusion depths. One process involves building a layered structure where a zinc oxide coated source wafer is placed in proximity over the recipient GaAs wafer. This arrangement avoids the need to supply arsenic thereby leading to improved safety. In this "proximity" method, the source wafer confines the arsenic and the zinc oxide provides the required zinc. To reduce the zinc concentration, an intermediate $SiO_2$ layer is used.

A modified process involves discarding the proximity source and sputtering zinc in $SiO_2$ directly on the wafer surface. This technique allows a limited and controlled amount of zinc to be transferred to the GaAs surface to achieve the desired diffusion profile with fewer process steps while holding the arsenic in the GaAs wafer surface. In another variation of the process the controlled amount of zinc is applied to the GaAs wafer surface as part of a GaAs cap layer growth. The GaAs cap layer is covered with an insulative layer that may be subsequently removed.

In the diffusion step, the zinc and arsenic vapors are confined to limit loss due to evaporation during heating such as by the presence of either a proximity source or an encapsulant layer, removal of which may follow the diffusion step.

New GaSb cells may be produced by providing a light, homogeneous diffusion of a conductivity-type modifier that is followed by a patterned, heavy diffusion of the conductivity-type modifier at positions under the grid lines. The light diffusion is effective to preserve the emitter surface minority carrier lifetime and the heavy diffusion provides a low ohmic resistance contact with the grid lines without requiring a time consuming etching step previously used that could not be automated easily for efficient large scale production. As an optional feature, the protective layer used as a mask for the patterned heavy diffusion may be made of a material which can serve as an antireflective (AR) layer thereby obviating extra steps in the manufacturing process.

Another advantageous, but optional, feature of the new GaSb cell is texture etching. Texture etched surfaces have reduced reflection losses. The texture directs reflections along the surface rather than away from the surface. For a given absorption wavelength, the light effectively is absorbed closer to the surface and closer to the junction. We have found that texture etching may be incorporated on the novel GaSb cells that are fabricated by using the two-step diffusion process.

These and other features of the invention will become more fully apparent from the claims and from the description as it proceeds in conjunction with the drawings.

BRIEF DESCRIPTION OF DRAWINGS

FIGS. 6A-6E illustrate the steps in a novel process for fabricating GaAs solar cells on a large scale;

FIGS. 7A-7E illustrate the steps in a similar process which is an alternative to that described in connection with FIGS. 6A-6E.

FIGS. 8A-8D illustrate the steps in yet another process which is an alternative to that described in connection with FIGS. 6A-6E.

FIGS. 9A-9F are process flow steps outlining a novel process for fabricating a III-V booster GaSb solar cell in accord with the present invention;

DETAILED DESCRIPTION OF PREFERRED EMBODIMENTS

Figure 1:
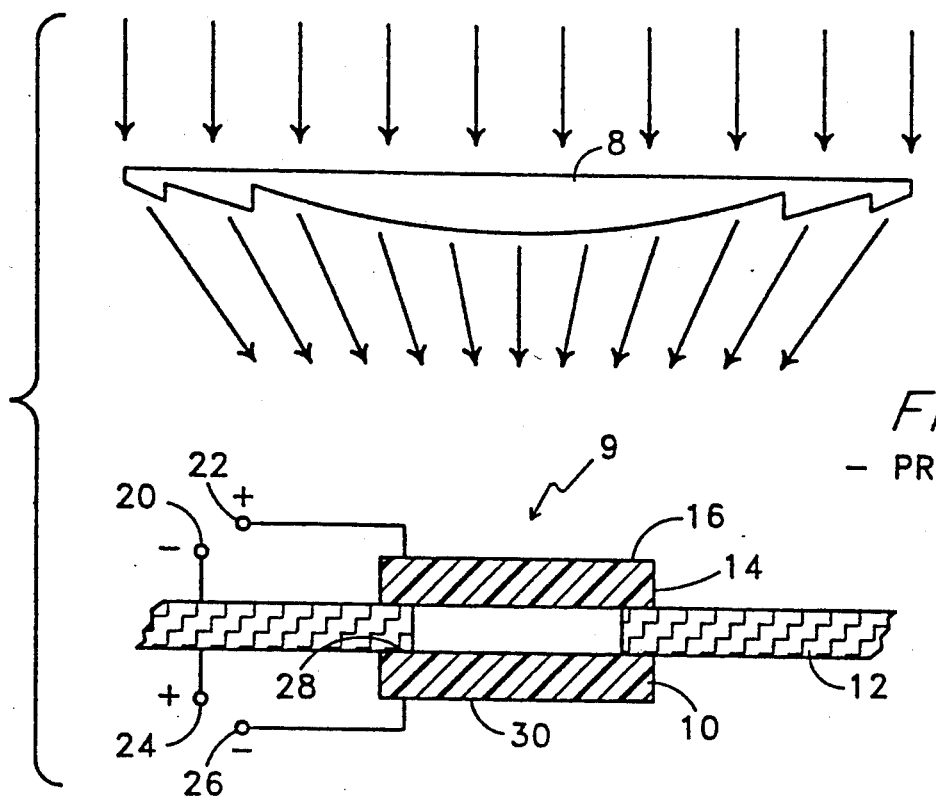
FIG. 1 is a diagrammatic view in section of a known tandem solar cell which has an upper GaAs and a lower GaSb cell mounted so that solar radiation received by the lower cell is first passed through the upper cell.

Referring to FIG. 1, a concentrator module which includes a solar energy concentrator lens 8 to focus light rays onto a tandem solar cell 9 is similar in many respects to that disclosed in co-pending Fraas et al. U.S. patent application No. 07/523,710, now U.S. Pat. No. 5,091,018, which is incorporated by reference for all purposes. GaSb cell 10 is shown mounted on the lower surface of a heat spreader 12 to be optically aligned with and below the GaAs cell 14 which is mounted on the upper, front side surface of the heat spreader 12 with an upper GaAs cell surface 16 facing the concentrator lens 8 and a source of radiation, not illustrated. Electrical terminals 20, 22, 24, 26 are connected to metallization on the front and back sides of the respective upper and lower solar cell surfaces.

Figure 2:
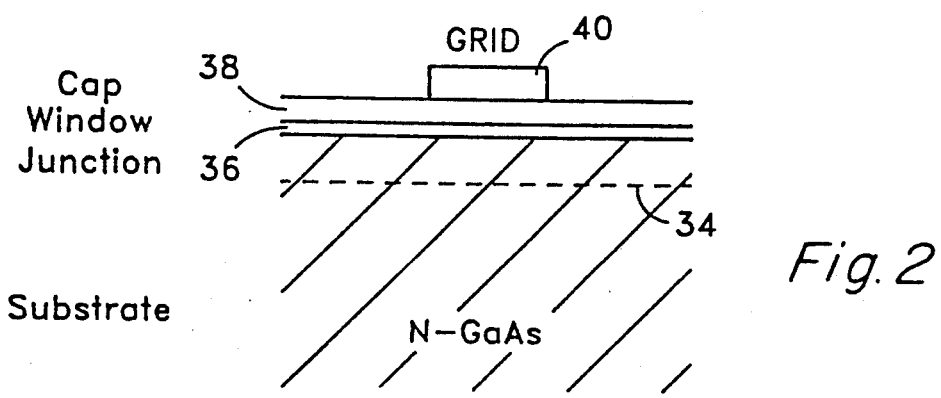
FIG. 2 is a diagrammatic view of a novel GaAs solar cell of the present invention where the emitter is diffused into an existing GaAs wafer or substrate.

A GaAs solar cell 14 according to the present invention differs from GaAs cells made by epitaxy in that the p on n junction at line 34 is located in the wafer material as shown in FIG. 2. The GaAs wafer material may have an n-type dopant concentration of about $3 \times 10^{17}/cm^3$. The p dopant has an AlGaAs/GaAs interface concentration between about $10^{19}/cm^3$ and $10^{18}/cm^3$ and the concentration is controlled to fall off to a lower value to form a diffusion profile. The junction 34 is where the transition between n-type and p-type occurs. An AlGaAs window 36, a GaAs cap 38 and metallization including grid lines 40 are applied by conventional means to complete the cell.

Figure 3:
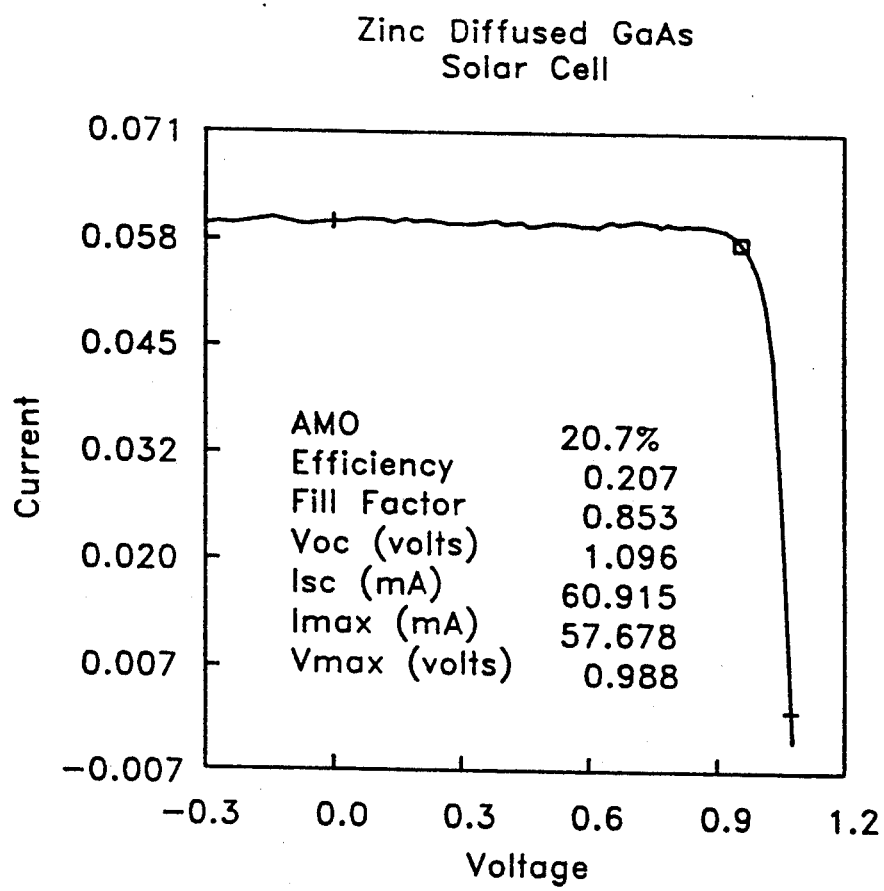
FIG. 3 is a graphical representation of the typical current-voltage relationship of a diffused junction GaAs solar cell made in accord with the present invention.

The emitter junction for the GaAs cell is advantageously formed by a diffusion process instead of by epitaxy to reduce the large-scale production cost. The zinc diffused GaAs cells that can be fabricated in a closed tube diffusion process using zinc/arsenic vapors have a performance as is illustrated by FIG. 3 that is similar to those fabricated by the usual epitaxy process. Similar short circuit currents can be obtained in doped GaAs wafers made by the prior art epitaxy process and diffusion processes of the present invention.

High solar conversion efficiencies are provided by a GaAs solar cell that has a conductivity-type modifier concentration of approximately $2 \times 10^{18}/cm^3$ at the emitter surface or AlGaAs/GaAs interface and an emitter thickness or junction depth of approximately 0.8 micrometer. With an n-GaAs substrate, a p-dopant is used. The preferred p-dopant is zinc, although other conductivity modifiers may be used. Preferably the emitter dopant concentration falls off towards the junction and away from the upper GaAs wafer surface.

Figure 4:
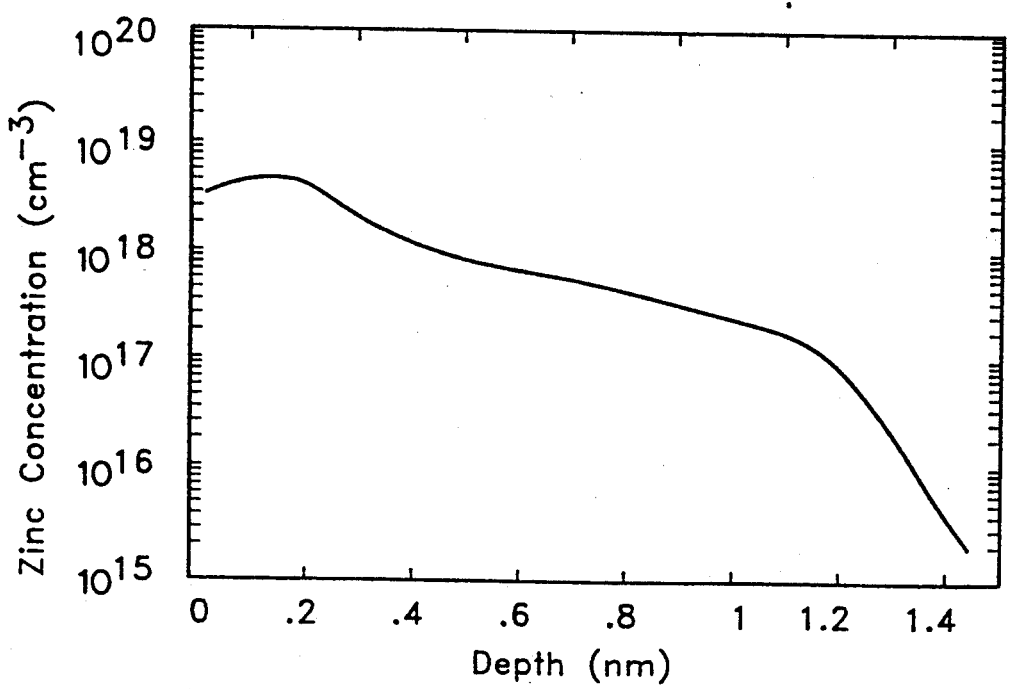
FIG. 4 is a graph showing the profile of the zinc concentration vs. depth in a preferred diffusion junction GaAs wafer.

Emitter surface dopant concentration and the emitter thickness are, for solar cells, two key parameters for a desired diffusion profile as illustrated in FIG. 4. There the zinc concentration at the AlGaAs/GaAs interface on the wafer surface and to an emitter depth of up to about 0.5 micrometers is less than about $10^{19}/cm^3$ to preserve the emitter minority carrier lifetime and to maintain a high light generated current and hence good short circuit currents. Similarly, a junction depth greater than about 0.5 micrometers is important for a high current. A zinc concentration of at least about $10^{18}/cm^3$ in the region down to 0.5 micrometers is important to maintain a low series resistance with the grid lines 40 that are shown in FIG. 2.

Typically, it is desirable for the GaAs wafer to have an upper AlGaAs window 36 and cap layer 38 having thickness of 0.2 micrometer. The emitter extends to where doping changes from $10^{18}/cm^3$ to $10^{17}/cm^3$ at a junction having a depth of between about 0.6 and 1.0 micrometer. An emitter depth of between about 0.6 and 0.8 micrometer is preferred.

The actual amount of zinc in the emitter is surprisingly small. A fraction of a monolayer on a flat surface area is sufficient for the number of zinc atoms that are needed. The number needed is about $1.6 \times 10^{14}/cm^2$, which is equivalent to approximately 10% of a monolayer. By limiting the amount of zinc which is transported to the GaAs wafer surface during deposition, it is easier to maintain the zinc concentration at the surface below $10^{19}/cm^3$, thereby retaining the conversion efficiency of the cell.

The present invention provides the desired doping wafer surface concentration and gradient profile as shown in FIG. 4.

The new GaAs cells of the present invention are characterized by having an upper surface doping concentration that is between about $10^{19}/cm^3$ and $10^{18}/cm^3$ which falls off to provide a doping profile generally as depicted in FIG. 4. The prior art dopant concentration for diffused junction GaAs cell is much too high to maintain a high solar cell efficiency The process thus may start by limiting the amount of zinc that is available for being driven-in during the heating process. So that reproducible results are obtained in large scale manufacturing, steps are taken to control the loss by evaporation of zinc. These same steps can also hold the arsenic in the GaAs wafer surface to avoid the need for adding arsenic during the heating step.

A zinc proximity diffusion technique may use a zinc oxide film that is first deposited on a source wafer of an oxide of aluminum or silicon for example.

Figure 5:
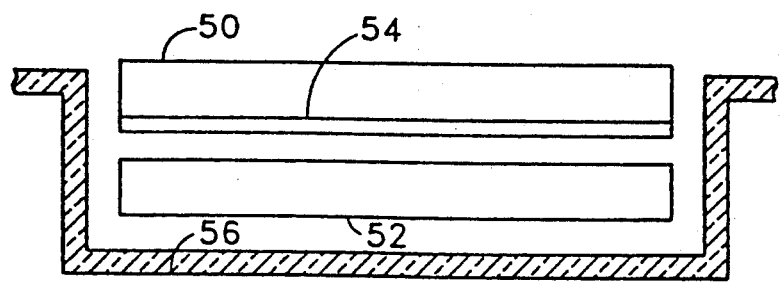
FIG. 5 is diagrammatic view of a sandwich structure that may be employed when using a ZnO proximity source for obtaining the zinc profile of FIG. 4.

The source wafer 50 is held adjacent to the undoped GaAs wafer 52, as illustrated in FIG. 5, to form a sandwich structure. Such a sandwich structure can be stacked on a holder 56 inside a quartz tube (not shown) and heated in an inert gas ambient that is free of oxygen, arsine, or arsenide vapors. When the sandwich is heated to a temperature in the range of about 600° to 700° C., zinc from ZnO is transported onto the GaAs wafer surface. The heating time depends on the amount of zinc to be transported.

The emitter depth and the surface concentration of zinc in the recipient GaAs wafer depend also upon the annealing temperature and time. When annealing was performed at 575° C. for two hours, the surface concentration was well in excess of $10^{19}/cm^3$ and the emitter depth was about 0.3 micrometers. When annealing was performed at 700° C. for 15 seconds, the surface concentration was approximately $10^{20}/cm^3$ and the emitter depth was again approximately 0.3 micrometer. Annealing for many hours at a lower temperature was required to obtain an acceptable emitter depth.

Since the surface concentration of zinc may be too high following the diffusion in this ZnO proximity method, a subsequent anneal and etch step can be used to reduce the zinc surface concentration by driving the zinc further into the wafer. This subsequent anneal may be carried out in preparation for adding the AlGaAs window 36 by epitaxy.

A thin film of an insulative material, SiO$_2$, can be deposited on the GaAs wafer before the second anneal to diffuse the zinc into the wafer surface. In one procedure the SiO$_2$/GaAs wafer was annealed at 725° C. for two hours in the same forming gas used in the zinc transport step. After the anneal, the SiO$_2$ was removed by chemical etching. The surface concentration of zinc was reduced to between $10^{19}/cm^3$ and $10^{18}/cm^3$ over a depth up to 0.5 micrometer. The zinc concentration was about $5 \times 10^{16}/cm^3$ at 1.2 micrometers. The GaAs wafer had about 0.5 micrometer of a p+ contacting layer with an underlying p region of about 0.7 micrometer and with doping varying from about $10^{18}/cm^3$ to $5 \times 10^{16}/cm^3$.

The preferred doping profile can alternatively be achieved on a GaAs wafer by a three step process (see FIG. 6) which involves first sputtering a suitably zinc doped SiO$_2$ layer onto the GaAs wafer to transfer the zinc to the GaAs surface. Other zinc doped oxides may be used. When a 1% zinc doped oxide was used, the amount selected for introduction into the process chamber was that which would provide about $1.6 \times 10^{14}$ zinc atoms per cm$^2$. The absolute amount of zinc available, of course, is regulated by controlling the sputtered oxide thickness, which in this example was about 100 angstroms. An insulative film of silicon nitride, which serves as an insulating confining layer, is deposited onto the GaAs wafer surface. The confining layer may be silicon oxynitride and is labeled on the drawings in FIG. 6A, 7D and C as SiN$_x$.

As a second step, the intermediate product was heated in the forming gas to the drive-in temperature of about 700° C. for about two hours to obtain a doping profile where the surface concentration of zinc was between $10^{18}/cm^3$ and $10^{19}/cm^3$ and the emitter junction depth was at about 0.8 micrometer. The doping profile was similar to that described in connection with FIG. 4. Thereafter, the silicon dioxide and silicon nitride films were removed by etching as the third step of this procedure to leave the doped GaAs wafer for further processing.

In completion of a GaAs solar cell, an AlGaAs window layer may be added by a conventional epitaxy process before grid metallization and conventional antireflection (AR) coatings are applied to complete the cell.

The AlGaAs window and GaAs cap can be deposited before zinc diffusion (the zinc can diffuse through them) so long as the zinc concentration is low enough to avoid substantial window layer smearing. Alternatively, it is possible to grow the AlGaAs window and GaAs cap layers after diffusion; in this event the AlGaAs window is preferably heavily doped with carbon.

Two alternative procedures are diagrammatically illustrated by FIGS. 6 and 7 where the zinc dopant is contained in a zinc doped silicon dioxide.

In FIG. 6A, the zinc doped silicon dioxide and the silicon nitride have been sequentially applied while the GaAs wafer is in the same process chamber. The heating step causes drive-in of the zinc to form the junction that is indicated by the dashed line in FIGS. 6B–6E. At the etching step, the silicon nitride and silicon dioxide are removed (etched) as illustrated in FIG. 6C. The AlGaAs window and GaAs cap layers are thereafter added by the epitaxy process as illustrated in FIG. 6D and the individual units which may be about 7 mm by 8 mm are isolated as indicated by FIG. 6E.

In FIG. 7A, the cell is shown with the AlGaAs window and GaAs cap layers in place. The zinc doped silicon dioxide is sputter deposited (FIG. 7B), a cell area is isolated (FIG. 7C) to pattern the zinc dopant, and the silicon nitride layer is added as a homogeneous layer (FIG. 7D). Finally, the wafer is heated to the drive-in temperature for a time sufficient to obtain the desired dopant profile. Thereafter, the wafer is ready for metallization. A patterned etching removes part of the silicon nitride and silicon dioxide layers. A bus bar is advantageously electrically insulated from the emitter on the upper surface of the SiO$_2$/SiN$_x$ the grid lines.

FIGS. 8A–8D illustrate a process similar to that described in connection with FIGS. 7A–7E wherein instead of sputtering the Zn and SiO$_2$ on the GaAs cap layer, the Zn atoms required at a density of about $1.6 \times 10^{14}/cm^2$ are added to the GaAs cap layer 38 (FIG. 2). The step illustrated in FIG. 7B is eliminated, and the steps corresponding to FIGS. 8B, 8C and 8D are the same as those described in connection with FIGS. 7C, 7D and 7E.

The silicon nitride cover or encapsulation film prevents the escape of zinc before the required emitter junction depth is obtained. With the sequencing described in connection with FIGS. 7A–7E and 8A–8D, the silicon nitride and underlying silicon dioxide can remain (and preferably do remain) in place under the bus portion of the upper surface metallization.

The present invention pertains in part also to the lower GaSb cell 10 as well, because both cells are important to performance of the tandem, and for that cell, it relates to a two step doping procedure during fabrication of the metallization on the front side 28 and back side 30. One conventional process involved the following steps:

1. Silicon oxynitride was deposited on the front side of an n-type GaSb semiconductor substrate or wafer as a uniform layer and a central cell area was defined by lithography. The silicon oxynitride was etched away to open the central area by a conventional etch.

2. A conductivity-type modifier (zinc) was diffused into the cell area from a zinc/antimony source in a confined volume which resulted in some diffusion into the back side of the wafer.

3. The back side was etched to remove the zinc-diffused region and back metal was deposited.

4. The location of the front side metallization including grid lines on surface 28 shown in FIG. 1 was defined lithographically. Front metal was deposited and lifted off between the grid lines.

5. The cell was then placed in an etching solution to remove a portion of the zinc diffusion region between the grid lines to form the emitter. Where the zinc diffusion reached a depth of about 0.5 micrometer, about 0.4 micrometer of emitter material was removed by the etch leaving about 0.1 micrometer. This step resulted in the short circuit current rising by a factor of about 2.

6. An antireflection coating (e.g., tantalum pentoxide) having a thickness of approximately 0.15 micrometer was applied which was found to raise the short circuit current by about another 1.5 times.

Although this technique was successful in creating efficient GaSb cells, the frontside emitter etch was time consuming and could not be readily automated. Each wafer had to be etched, rinsed, electrically tested, re-etched, rinsed, and then re-measured until the proper depth was reached. The typical wafer was put through this cycle many times before the electrical current reached its optimum value. If the wafer was etched too long, the voltage would noticeably drop quickly. Because of variations in the etch strength and in the emitter depth from wafer to wafer, no standard etch time could be reliably established. Also, the frontside and backside metal needed to withstand the etching solution, which severely restricted the choice of metals. Gold was ultimately chosen as the preferred top layer in both the front and back metallization layers because of its high electrical conductivity and its ability to withstand most etchants. Gold, however, is expensive and diffuses readily even at low temperatures. If the prior cell was heated, it was possible for gold to diffuse along the side of the grid lines and into a region of the cell that had been etched back to a shallow zinc diffusion. On occasions, gold would diffuse into the cell past the junction, thereby shunting the cell and lowering the voltage.

In the present invention, the front side emitter etch is eliminated by changing from a single heavy diffusion to provide a low ohmic contact resistance with the front side metallization followed by the etch to, instead, a first, light diffusion that gives an improved short circuit current due to a favorable minority carrier lifetime, followed by a heavy diffusion under the grid lines to give the low ohmic contact resistance.

The new two step or double diffusion process will be described in conjunction with FIGS. 9A–9F. The key elements of the process are:

1. Silicon oxynitride may be applied by a plasma-enhanced deposition step on the front side, the cell area(s) are next defined by lithography and the silicon oxynitride is thereafter etched away, see FIG. 9B, in the central cell area.

2. The conductivity-type modifier is diffused into the open central cell area from an appropriate source. In the illustrative example where the wafer material is GaSb, the preferred source is zinc/gallium, although others may be used. By using a low temperature, a light, uniform shallow diffusion 80 in FIG. 9C is obtained throughout the central cell area. The silicon oxynitride is an electrical insulator and a diffusion barrier. The appropriate degree of diffusion is that amount which is effective to preserve the minority carrier lifetime to achieve approximately double the short circuit current. As compared with the current obtained if a heavy diffusion is used. The light diffusion depth may be approximately 0.1 micrometer.

3. Silicon nitride is applied to the front side, and grid lines are defined by lithography and etching as illustrated in FIG. 9D. The silicon nitride is deposited to a thickness that makes a good antireflection (AR) coating, generally about 0.15 micrometers. Such a protective coating prevents a further zinc diffusion in the entire emitter during the second diffusion step.

4. A conductivity-type modifier is diffused at a higher temperature and for a longer time over the exposed grid lines in a heavy concentration of about $10^{20}/cm^3$ to provide a diffusion pattern as illustrated in FIG. 9E having a low ohmic contact resistance with the conductive material of the grid lines. The diffusion depth is typically about 0.5 micrometers. Although a different conductivity modifier may be used, it is convenient to use a zinc/gallium source again. Although the light diffusion will become somewhat deeper because of the high temperature of the deep diffusion process, the emitter will still remain sufficiently shallow to maintain a high short circuit current. The reason for this is that zinc diffuses faster when it is in a higher concentration. After the deep diffusion process, the light diffusion depth may increase to approximately 0.2 micrometer.

5. A photoresist layer is applied to the entire front side of the wafer to protect against the next etch.

6. Zinc-diffused regions of the back side of the wafer are etched away before depositing a backside metallization. The backside contact metal currently preferred is indium tin oxide (ITO)/titanium tungsten nitride/silver with silver at the exposed surface as illustrated in FIG. 9F. This improved metal contact is the separate invention of John M. Martin and is preferred because it has improved adhesion properties relative to those of titanium/palladium/gold metallization that was previously used with GaSb.

7. The frontside metallization is thereafter completed by defining the grid lines lithographically, depositing the metal and lifting off the unwanted metal between the grid lines. The frontside metal currently preferred is molybdenum/palladium/silver with silver at the exposed surface.

In both the frontside and backside metallization, gold or other good electrical conductors may be substituted for silver. However, since the wafer is not subjected to an etching solution after metallization has been applied, the use of an exposed metal that is resistant to the etching solution is not required when using the process just described.

Figure 10:
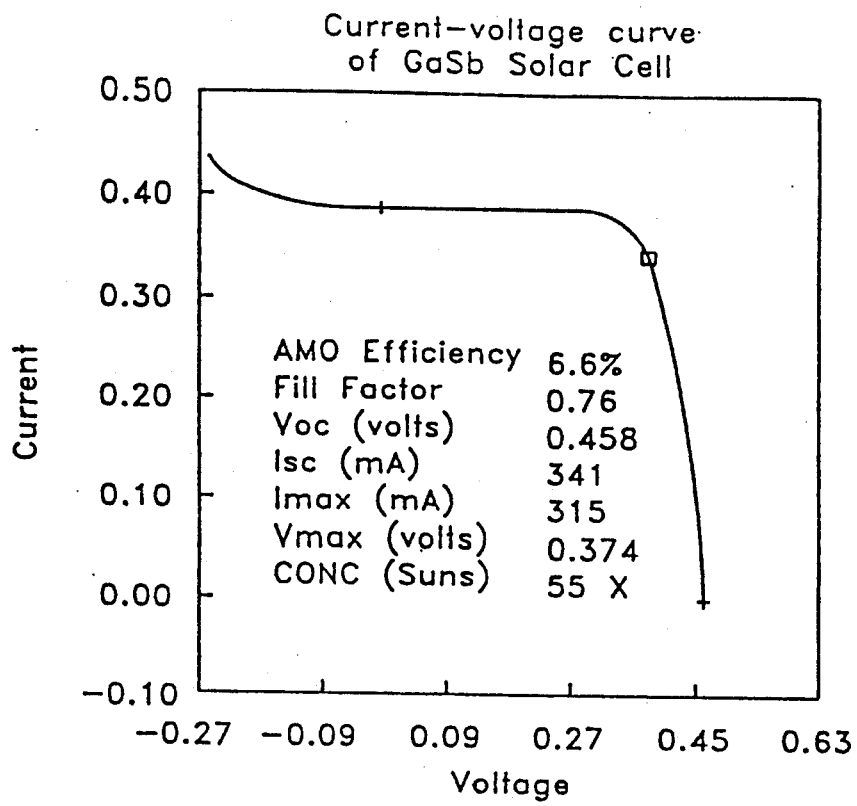
FIG. 10 is a graphical representation of the typical current-voltage relation of a GaSb solar cell fabricated according to the present invention.

FIG. 10 shows a typical current-voltage curve for a double diffusion GaSb wafer with a zinc dopant made in accordance with the process described in connection with FIG. 9. Exposure was equivalent to a concentration of 55 suns behind a GaAs filter which may be equivalent to the upper cell 14 as shown in FIG. 1. In the test cell, gold was used instead of silver as part of the metallization, and silicon oxynitride was used in both deposition steps 1 and 3. Cells have efficiencies up to about 6.6% with open circuit voltages of between about 0.45 and 0.46 volts and short circuit currents of as much as 340 milliamps.

Short circuit currents in GaSb cells made in accordance with the present invention may be further increased by texture etching the upper or frontside wafer surface prior to the first diffusion step. Texture etching involves controlled, deliberate roughening the smooth upper wafer surface. If properly dimensioned, the etching can improve short circuit currents by reducing reflection losses, and by deflecting incident light normal to the surface to avoid deep penetration of the light into the cell so that, for a given absorption length, the light is absorbed closer to the junction. The texture etch period and depth must be properly chosen.

Figure 11:
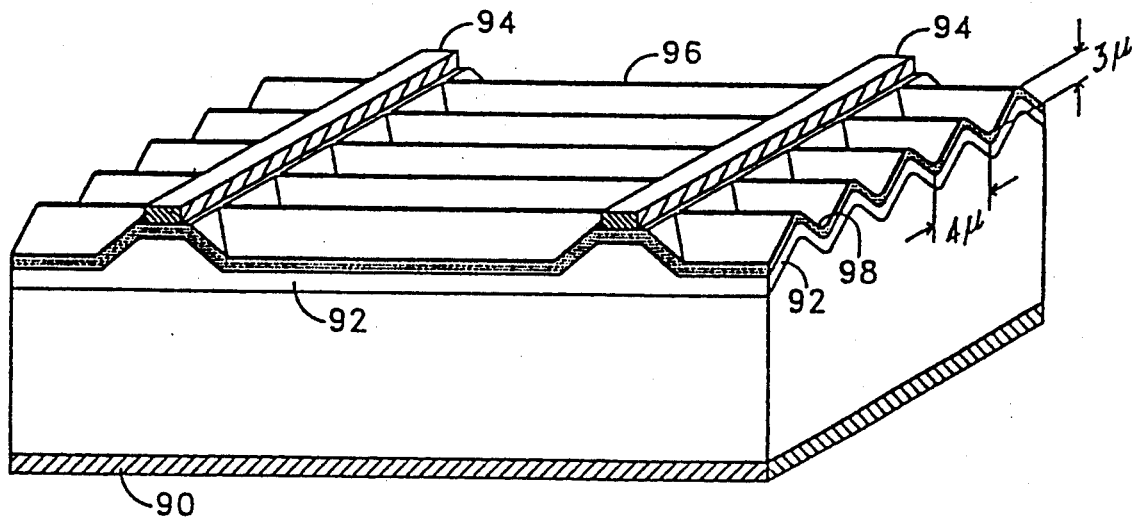
FIG. 11 is a pictorial drawing illustrating a texture etched front surface on a GaSb solar cell in accordance with the invention.

The texture etched surface on a GaSb cell is illustrated in FIG. 11. The texture etch period (i.e. The distance between peaks) may be about 4 micrometers as marked. The texture etch depth should be larger than the wavelength of about 1.6 micrometers to which GaSb is photoactive and smaller than the minority carrier diffusion length in the base of the shallow junction cell which has been measured to be about 3 micrometers. The texture etch depth is preferably no greater than about 3 micrometers as illustrated in FIG. 11.

Chemical etches for GaSb normally consist of an oxidizing agent such as hydrogen peroxide, mixed with an acid such as hydrochloric acid, that reacts with the oxides of Ga and Sb. To obtain the desired texture etch profiles beneath a photoresist mask on a (100) oriented GaSb crystal surface requires anisotropic etching through proper choice of the composition and strength of the etching solution. In one example, the GaSb wafer was etched in an agitated solution of 1 part 30% aqueous hydrochloric acid, 1 part 30% aqueous hydrogen peroxide, and 2 parts de-ionized water at room temperature for about one minute. After this etching the GaSb was thoroughly rinsed and dried. The resist on the wafer was then removed. The anisotropy is primarily brought about because the (111) Ga planes etch at a different rate from (111) Sb planes. A V groove or a saw tooth pattern that has ridges 96 and grooves 98 running perpendicular to the grid lines 94 is obtained in the space between the grid lines. The grid lines 94 typically have a spacing of about 120 micrometers.

In a preferred cell, the grid lines 94 may be somewhat relative to the textured surface since the grid line positions are protected from the texturing etchant. The ridges 96 formed by the etchant may in some cases be about 2 micrometers wide and separated by about 2 micrometers to give a period of 4 micrometers.

The light zinc diffusion as discussed in connection with FIG. 9C provides a homogeneously applied p doped region 92 that has a depth of a small fraction of a micrometer under the textured surface. Under the grid lines 94 where the heavy diffusion is subsequently applied as described in connection with FIG. 9E, a heavier doped region is provided where the depth may be as much as 0.5 micrometer.

The cell illustrated in FIG. 11 has a lower surface to which the backside metallization 90 is applied as described in connection with FIG. 9F. Frontside metallization is applied as described above.

The layer 98 shown in FIG. 11 may be an antireflective (AR) layer such as silicon nitride or tantalum pentoxide having a thickness of about 0.15 micrometer or an oxide layer which is subsequently etched away and replaced by an AR layer.

While the preferred embodiments overcome problems that are unique to n-type GaSb semiconductor wafer materials, many of the benefits of the double diffusion processes and texture etching are applicable to other gallium containing semiconductor wafers and generally applicable to the III-V semiconductor materials where desired. Similarly, the novel methods of making diffused GaAs wafers are useful for applications not necessarily limited to solar cells. Modifications and changes may be made without departing from the spirit of this invention. All such modifications and changes which fall within the scope of the claims and equivalents thereof are intended to be covered.

We claim:

1. A solar concentrator module comprising: a tandem solar cell including an upper diffused junction n-type GaAs wafer solar cell and a lower diffused junction n-type GaSb wafer solar cell;

said GaAs cell having a graded emitter conductivity-type modifier concentration effective to preserve emitter carrier lifetime and to maintain a low series resistance and a high light generated current and a junction depth that is sufficient to provide high light generated current; and said GaSb cell receiving light passing through the GaAs cell and having at an upper surface a first light, relatively shallow, relatively uniform diffusion of conductivity-type modifier effective to preserve emitter carrier lifetime between grid first and a second, heavy diffusion of conductivity-type modifier under the rid lines to maintain a low series resistance, wherein the GaAs cell has a conductivity-type modifier concentration greater than $10^{18}/cm^3$ but less than bout $10^{19}/cm^3$ in a first region extending from about 0.1 to 0.5 micrometers from the upper surface thereof, followed by an emitter junction where the doping concentration decreases from between about $10^{18}/cm^3$ to $10^{17}/cm^3$ at a distance between about 0.6 to 1.0 micrometers from said surface, and wherein the first light diffusion on the GaSb cell is homogeneous to provide a junction at said shallow depth and the second heavy diffusion is patterned and provides a junction at a greater diffusion depth only under the grid lines.

2. The solar concentrator module of claim 1 wherein the GaSb cell has a texture etch on said upper surface that is effective to lower reflection of incident solar radiation thereby leading to increased currents, said texture etch being positioned between said grid lines and having a depth larger than the wavelength to which GaSb is photo responsive and smaller than the minority carrier diffusion length.

3. The solar concentrator module of claim 1 wherein the GaSb cell has a texture etch between said grid lines comprising substantially parallel ridges and grooves which extend in a direction substantially perpendicular to said grid lines, the depth of said grooves being between about 1.6 to 3 micrometers and the period between adjacent ridges being approximately 4 micrometers.

4. A GaAs/GaSb tandem solar cell having high conversion efficiency, comprising:
   a GaAs upper cell having a transparency for radiation to which GaSb is responsive and metallization on at least the upper surface thereof;
   a GaSb lower cell positioned beneath the GaAs upper cell to receive radiation through the GaAs upper cell with metallization on upper and lower surfaces thereof, said upper surface metallization including spaced grid lines;
   said GaAs cell having under its upper surface metallization a diffusion of a conductivity-type modifier that provides a graded doping with the conductivity-type modifier surface concentration being effective to preserve emitter minority carrier lifetime and to maintain a low series resistance and a high light generated current; said graded doping providing a junction depth that is sufficient to provide high light generated current; and
   said GaSb cell having at said upper surface a first light, relatively shallow, relatively uniform depth diffusion of a conductivity-type modifier to preserve emitter carrier lifetime between grid lines and a second, heavy diffusion of conductivity-type modifier that extends to a greater depth only under the grid lines to maintain a low series resistance.

5. The tandem solar cell of claim 4 wherein the GaSb cell has a texture etch on said upper surface that is effective to lower reflection of incident solar radiation thereby leading to increased currents, said texture etch being positioned between said grid lines and having a depth larger than the wavelength to which GaSb is photo responsive and smaller than the minority carrier diffusion length.

6. The tandem solar cell of claim 4 wherein the GaSb cell has a texture etch between said grid lines comprising substantially parallel ridges and grooves which extend in a direction substantially perpendicular to said grid lines, the depth of said grooves being approximately 1.6–3 micrometers and the period between adjacent ridges being approximately 4 micrometers.

7. A GaSb solar cell having:
   metallization on upper and lower surfaces thereof with said upper surface metallization including spaced parallel grid lines;
   a texture etch on said upper surface between said grid lines to provide lower reflection of incident solar energy and higher currents; and
   underlying zinc diffusion which has a shallow depth between the grid lines to provide a shallow junction cell having a favorable minority carrier lifetime and a greater diffusion depth under the grid lines to provide a low ohmic contact resistance.

8. The solar cell of claim 7 wherein said texture etch comprises parallel ridges and grooves that run substantially perpendicular to the grid lines with the groove depth being larger than the solar energy wavelength to which GaSb is photoresponsive and smaller than the minority carrier diffusion length.

9. The solar cell of claim 8 wherein the depth of said grooves is approximately 1.6–3 micrometers and the period between adjacent ridges is approximately 4 micrometers.

10. A method for making a diffused junction III-V wafer, comprising the steps of:
    depositing on a surface of said wafer a conductivity modifier in an amount less than that which forms a monolayer; and
    thereafter heating said wafer to diffuse the conductivity modifier into the wafer to provide a diffused active region having a graded doping concentration greater than $10^{18}/cm^3$ but less than about $10^{19}/cm^3$ in a first region extending from about 0.1 to 0.5 micrometer from the surface to preserve emitter carrier lifetime and maintain a low electrical resistance, followed by an emitter junction where the doping concentration decreases to between about $10^{18}/cm^3$ to $10^{17}/cm^3$ at a distance between about 0.6 to 1.0 micrometer from the surface to provide high light generated current.

11. The method of claim 10 wherein the amount of conductivity modifier that is deposited for subsequent diffusion is equivalent to that which would produce about 10% of a monolayer.

12. The method of claim 11 wherein the wafer is n-type GaAs, the conductivity modifier is zinc and the concentration of zinc atoms deposited is about $1.6 \times 10^{14} cm^2$.

13. The method of claim 10 including the further steps of:
    applying an encapsulating layer of insulating material on said conductivity modifier before the heating step that is effective to avoid loss of the resulting conductivity modifier by evaporation at the wafer surface; and
    removing at least part of the insulating material layer after the heating step.

14. The method of claim 13 wherein the insulating material is a proximity source wafer.

15. The method of claim 13 wherein the insulating material is an encapsulant layer of silicon nitride or silicon oxynitride.

16. The method of claim 13 wherein the wafer is GaAs and the process further comprises adding an AlGaAs window layer and a GaAs cap layer on the window layer, said GaAs cap layer containing the conductivity modifier.

17. The method of claim 10 wherein the conductivity modifier is a metal oxide doped with zinc that is deposited as an oxide film; and
    the process further comprises removing at least part of the oxide film after the heating step.

18. The method of claim 17 wherein the wafer is GaAs and the process further comprises adding an AlGaAs window layer by an epitaxy process after the heating step.

19. The method of claim 17 comprising the further steps of:
    adding a film of insulating material over said zinc doped oxide film before said heating step, said insulating material being effective to reduce zinc loss by evaporation at said wafer surface during the heating step; and removing at least part of said insulating material film along with the removal of at least part of the oxide film by etching before applying front surface metallization on the wafer to form a photovoltaic device.

20. The product of the method of claim 17.

21. The method of claim 10 wherein the wafer is GaAs;
the amount of conductivity modifier to be added during diffusion is applied during application of a GaAs cap layer, and the process further comprises;
encapsulating said GaAs layer with an insulating layer before the heating step, said insulating layer being effective to reduce conductivity type modifier loss by evaporation during the heating step; and
removing at least part of said encapsulating layer after the heating step.

22. The method of claim 21 wherein the conductivity modifier is zinc, and the GaAs cap layer has a thickness of about 0.2 micrometer and is doped to about $1 \times 10^{19}/cm^3$.

23. The product of the method of claim 21.

24. The method of claim 10 wherein wafer is GaAs, the conductivity modifier is applied as a 1% zinc doped silicon oxide that is sputtered to a thickness of about 100 angstroms and is covered by a sputtered insulative film prior to the heating step to reduce zinc loss by evaporation during heating.

25. The method of claim 24 wherein the zinc doped silicon dioxide and the insulative film are deposited in a process chamber to provide a three step diffusion procedure consisting of the deposit step in the process chamber, a diffusion step outside the process chamber and film removal by etching.

26. The method of claim 10 wherein the wafer is GaAs and the conductivity modifier is zinc oxide that is introduced on a surface of a source wafer and the method further comprises:
sandwiching said zinc oxide between said wafers in a heated forming gas free of aersine and oxygen for a time sufficient to diffuse zinc from said zinc oxide into said wafer surface;
etching off a thin layer from the GaAs wafer surface through which the zinc was diffused; and
depositing a window on said eteched surface prior to applying metallization for producing a photovoltaic device.

27. The method of claim 26 wherein the source wager material is silicon dioxide or aluminum oxide and the process further comprises annealing the sandwich at a temperature of about 725° C. for about two hours in said forming gas.

28. The method of claim 10 wherein the wafer is GaAs and the conductivity modifier is zinc oxide on a surface of a source wafer and the method further comprises:
sandwiching the zinc oxide between said wafers in a heated forming gas free of arsine and oxygen for a time sufficient to transport since from said zinc oxide onto said GaAs wafer surface;
depositing silicon dioxide to form a thin confinement layer over said zinc to reduce zinc vapor loss at the GaAs wafer surface during a subsequent second heating step;
heating the wafer a second time to diffuse zinc deeper into the GaAs wafer; and thereafter removing at least part of the silicon dioxide layer.

29. The product of the method of claim 28.

30. The product of the method of claim 10.

31. A method for doping a III-V solar cell wafer to provide a non-uniform doping profile comprising:
diffusing a dopant into a wafer surface;
depositing a controlled amount of the dopant on the wafer surface;
capping said dopant with an insulating material that is effective to reduce loss of dopant by evaporation at the water surface;
heating the wafer to drive said dopant material into the wafer in a second diffusion step according to a profile which forms an emitter junction sufficiently distant from the wafer surface to provide high light current and a dopant concentration t the wafer surface that is effective to preserve emitter carrier lifetime; and
removing the layer of insulating material and excess dopant, if any, before completion of the solar cell.

32. The method of claim 31 wherein the emitter junction is formed at a depth of between about 0.6 and 1.0 micrometer from the wafer surface while maintaining a dopant concentration of between about $10^{18}/cm^3$ and $10^{19}/cm^3$ throughout the depth of between 0.1 and 0.5 micrometer from the wafer surface.

33. The method of claim 31 wherein said controlled amount of dopant deposited on the wafer is equivalent to about 10% of the amount necessary to form a complete monolayer on the wafer surface.

34. The method of claim 33 wherein the dopant is obtained rom a since doped silicon dioxide film that is sputter deposited on said wafer surface, the amount of zinc atoms is about $1.6 \times 10^{14}/cm^2$, and the insulating material is a film of silicon nitride.

35. The method of claim 31 wherein the dopant and insulating material are both sputter deposited on the wafer surface while in the same process chamber.

36. The method of claim 35 wherein the wafer is GaAs, the diffusion of the zinc into the wafer is performed by a three step process for large scale manufacturing efficiency, said three steps consisting of first, sputter depositing both the dopant and insulative material on the GaAs surface, second, heating the GaAs to a temperature for a time sufficient to produce said diffusion profile, and third, etching the GaAs surface to remove the layer of insulating material.

37. The product of the method of claim 31.

38. An intermediate product for use in producing a GaAs solar cell comprising a GaAs wafer having a layer with a predetermined amount of a conductivity modifier that has been applied on an upper surface thereof with the number of atoms of the conductivity modifier being less than are required to produce a monolayer, and a covering layer of insulative material on the upper surface of the metal oxide effective to confine vapors of said conductivity modifier at temperatures up to about 725° C.

39. The product of claim 38 wherein the insulative material is silicon dioxide, silicon nitride, or silicon oxynitride, and the conductivity modifier is zinc.

40. The product of claim 38 wherein the conductivity modifier is zinc and the number of zinc atoms is equivalent to about 10% of a monolayer.

41. The product of claim 38 wherein the conductivity modifier is zinc and concentration of zinc atoms is approximately $1.6 \times 10^{14}/cm^2$.

42. The product of claim 38 further including an AlGaAs window and a GaAs cap layer applied by epitaxy wherein the cap layer includes the conductivity modifier.

43. The product of claim 42 wherein the insulative material is silicon nitride or silicon oxynitride.

44. A method of making a diffused junction III-V wafer having grid electrode lines, comprising the steps of:
performing a light homogeneous diffusion of a conductivity modifier to a depth which preserves emitter surface minority carrier lifetime between grid line positions; and
thereafter performing a patterned heavy diffusion of a conductivity modifier only at said grid line positions to provide a low ohmic resistance contact between the grid lines and the emitter.

45. The method of claim 44 wherein the wafer is GaSb.

46. The method of claim 45 wherein the grid lines are parallel and the method further includes the step of etching said wafer prior to the light diffusion step at locations between the parallel grid line positions to form a texture etched surface with parallel ridges and grooves that are oriented substantially perpendicular to the parallel grid line positions.

47. The method of claim 46 wherein the texture etch has a groove depth that is larger than a wavelength to which GaSb is responsive and smaller than a minority carrier diffusion length in a shallow junction cell formed by said light diffusion and the texture etch period is about 4 micrometers.

48. The product of the method of claim 47.

49. A method for producing a front side grid electrode on a III-V wafer, comprising the steps of:
providing a III-V wafer of a first conductivity type;
forming an insulating layer on the front side of said wafer having an opening to provide an exposed portion that defines a cell area;
diffusing a conductivity modifier at a fist light homogeneous concentration to form an emitter having a substantially uniform thickness throughout the cell area;
depositing a coating of protective material on said emitter cell area;
forming openings in said protective coating material which expose positions in said cell area corresponding to grid line positions;
diffusion a conductivity modifier at a second higher concentration to form a heavy diffusion in said cell area through only said exposed grid line positions;
applying a further layer of photoresist on the front side before applying backside metallization and thereafter forming new openings in the photoresist to expose the grid lines which define a metallization pattern for said front side;
depositing a metal on said front side photoresist and in said new openings formed therein; and
thereafter removing said photoresist and any metal deposited thereon.

50. The method of claim 49 wherein the coating of protective material is deposited to a thickness sufficient to serve as an effective antireflective (AR) coating which remains in place after fabrication of the cell.

51. The method of claim 50 wherein the coating of protective material is silicon nitride.

52. The method of claim 49 wherein the wafer is GaSb, the conductivity modifier for both light and heavy diffusion steps is zinc with the light diffusion providing an emitter depth of about 0.1 micrometer and the heavy diffusion providing an emitter depth of about 0.5 micrometer.

53. The method of claim 49 wherein the wafer is GaSb and the method further includes the step of texture etching of the front side of said base layer prior to said light diffusion step, said texture etching forming parallel ridges and grooves which have a depth and spacing to provide reduced light reflection with the depth being larger than a wavelength to which the GaSb is responsive and smaller than the minority carrier diffusion length in a base of a shallow junction cell.

54. The method of claim 53 where in the depth of the grooves is less than approximately 3 micrometers and ridges and grooves are substantially uniformly spaced to have a period of approximately 4 micrometers.

55. The product of the method of claim 53.

56. The product of the method of claim 49.

57. A method of making a diffused junction GaSb wafer having an emitter with a texture etched surface, comprising the steps of:
masking grid line locations on the wafer upper surface;
forming a texture etch on said upper surface between said grid line locations to reduce reflection of incident solar energy comprising parallel ridges and grooves that run substantially perpendicular to said grid line locations with the groove depth being larger than the solar energy wavelength to which GaSb is photoresponsive and smaller than the minority carrier diffusion length;
forming a light, homogeneous diffusion of a conductivity modifier on said texture etched surface and grid line locations to provide a shallow junction emitter and preserve minority carrier lifetime;
forming a heavy diffusion of a conductivity modifier only at the grid line locations to provide a low ohmic resistance contact between the emitter and the grid lines; and
applying a patterned layer of metal along said grid line locations.

58. The method of claim 57 wherein said groove depth is approximately 3 micrometers and the period of adjacent ridges is approximately 4 micrometers.

59. The product of the method of claim 57.

60. An n-type GaAs wafer suitable for use in a solar cell when modified to form a photoactive emitter junction through diffusion of a conductivity modifier into a portion of the wafer, a predetermined volume of a removable film deposited over one surface of the wafer, the film including a predetermined concentration of the conductivity modifier such that the volume contains fewer atoms of the conductivity modifier than would be sufficient to form a monolayer of atoms of the conductivity modifier on the surface, and removable encapsulating means to reduce loss of the conductivity modifier from the film other than by diffusion of the conductivity modifier into the wafer.

61. A tandem solar cell concentrator module comprising:
(a) a concentrator lens for focusing incident solar radiation;
(b) a tandem solar cell substantially at the focus of the lens, the cell including:
(i) an upper AlGaAs/GaAs primary cell having:
(I) an AlGaAs window covering a photoactive region of a generally n-type GaAs wafer, and (II) a zinc-diffused, p-type emitter region having a concentration of zinc of between about $10^{18}$–$10^{19}$ atoms/cm$^3$; and (ii) a lower GaSb booster cell positioned to receive solar radiation that passes through the primary cell, the booster cell including grid lines on the upper surface for collecting current produced in the booster cell by incident radiation, a heavy concentration of zinc under the rid lines to provide low ohmic contact resistance, and a light concentration of zinc between the grid lines, the light concentration being effective to preserve the minority carrier lifetime in the booster cell to increase the short circuit current; wherein the booster cell includes texture etching to increase the conversion efficiency and to reduce reflection losses, the etching patterning the booster cell in the regions between the grid lines, and includes a backside metallization comprising layers of indium tin oxide, titanium tungsten nitride, and silver overlying one another, the indium tin oxide adjacent the GaSb and the silver at the exposed surface;

(c) a heat spreader attached to both the primary cell and booster cell for holding the two in proper spaced relationship and for conveying excess heat away from either to a heat sink; and (d) current collection means connected to the primary cell and booster cell for collecting current generated in both when solar radiation is focused on the module.

62. A texture etched GaSb booster cell for use in a tandem concentrator module comprising a double since diffused GaSb wafer, grid lines on the wafer with the concentration of zinc immediately under the grid lens higher than the concentration between grid lines, and a series of grooves to texture the light-receiving surface of the booster to reduce its reflections, further comprising a backside metallization of indium tin oxide on the GaSb, titanium, tungsten nitride over the indium tin oxide, and silver or gold over the titanium tungsten nitride to define the bottom exposed surface.

* * * * *